(12) United States Patent
Uchida

(10) Patent No.: US 6,475,333 B1
(45) Date of Patent: *Nov. 5, 2002

(54) DISCHARGE PLASMA PROCESSING DEVICE

(75) Inventor: Taijiro Uchida, Chigasaki (JP)

(73) Assignee: Nihon Shinku Gijutsu Kabushiki Kaisha, Chicasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 1061 days.

(21) Appl. No.: 08/279,789

(22) Filed: Jul. 25, 1994

(30) Foreign Application Priority Data

Jul. 26, 1993 (JP) .............................. 5-183899
Mar. 24, 1994 (JP) .............................. 6-052418
Mar. 24, 1994 (JP) .............................. 6-052419

(51) Int. Cl.⁷ .................. C23C 16/00; C23C 14/34; H01L 1/00
(52) U.S. Cl. ............... 156/345.35; 156/345.42; 156/345.46; 156/345.49; 118/723 MA; 118/723 MR; 118/718; 118/726; 204/298.16; 204/298.37
(58) Field of Search ............... 204/298.16, 298.19, 204/298.37; 156/345; 118/723 MA, 723 MR, 718, 726

(56) References Cited

U.S. PATENT DOCUMENTS

| | | | | |
|---|---|---|---|---|
| 4,023,523 A | * | 5/1977 | Ing ............................ | 118/726 |
| 4,217,855 A | * | 8/1980 | Takagi ....................... | 118/726 |
| 4,501,225 A | * | 2/1985 | Nagao et al. ............... | 118/728 |
| 4,511,594 A | * | 4/1985 | Yanai et al. ................ | 118/726 |
| 4,676,194 A | * | 6/1987 | Satou et al. ................ | 118/726 |
| 5,198,725 A | * | 3/1993 | Chen et al. ............ | 204/298.37 |
| 5,208,512 A | * | 5/1993 | Forster et al. ......... | 204/298.37 |
| 5,346,579 A | * | 9/1994 | Cook et al. ............ | 204/298.37 |
| 5,401,318 A | * | 3/1995 | Pearson ..................... | 156/345 |
| 5,429,070 A | * | 7/1995 | Campbell et al. ........... | 156/345 |
| 5,527,394 A | * | 6/1996 | Heinrich et al. .... | 204/298.37 X |

* cited by examiner

Primary Examiner—Rodney G. McDonald
(74) Attorney, Agent, or Firm—Larson & Taylor, PLC

(57) ABSTRACT

A discharge plasma processing device comprising a chamber with an evacuation system, a magnetic field generation system and an electric field application system with which the feature of operation is first to form a magnetic neutral line in the vacuum chamber and second to produce a plasma along the magnetic neutral line by controlling the shape of the line, its position related to an object to be processed and the plasma parameters is presented as useful device for many kinds of plasma processing like as sputtering, etching and plasma enhanced CVD as freely programmed, for instance extremely in uniform on the surface of the object.

16 Claims, 10 Drawing Sheets

A

NLD100 (−100)

neutral circle

R=190

B

NLD100 (−120)

neutral circle

R=155

C

NLD100 (−140)

neutral circle

R=80

(a)

(b)

(a)

(b)

DISCHARGE PLASMA PROCESSING DEVICE

BACKGROUND OF THE INVENTION

1. Field of the Invention

The present invention relates to a discharge plasma processing device.

2. The Prior Art

Plasmas are easily produced by applying a DC and/or AC electric field, and are utilized for many kinds of processing such as cleaning, coating, etching, sputtering and and plasma CVD on the surface of objects to be processed such as substrates and other targets. However, it is difficult to process the surface freely as programmed, for instance, to produce a surface that is sufficiently in uniform, without any other treatment.

A magnetic field is an effective means to localize in space the plasma production. When an electron cyclotron resonance phenomenon is used, plasma is produced at a position of specified magnetic field where the resonance arises, which works as a point plasma source. A planner magnetron discharge which is realized by a special combination of electric field E and magnetic field B near a cathode surface is also useful for sputtering process. However, the eroding efficiency of cathode target used is rather low even when the permanent magnet is set movably.

SUMMARY OF THE INVENTION

The very new idea proposed in accordance in with the invention is characterized by the use of plasma produced in a closed or opened magnetic neutral line which is made up with zero magnetic field points connected continuously. The plasma is produced by applying an electric field along the neutral magnetic line for which an alternative AC field is applied in the case of closed loop, while a direct DC field and/or AC field are used for the opened line case.

By choosing an adequate combination of current carrying conductors or a system of permanent magnets for the magnetic field composition, the magnetic neutral line is formed in an arbitrary shape of any size at a variable distance from the object to be processed. As these geometric parameters of the magnetic neutral line can be controlled even during the processing period as well as the plasma parameters can be controlled with rf power input, freely programmed processing, which enables extremely uniform processing, is easily realized.

It is, therefore, an object of the present invention to utilize a plasma produced in a magnetic neutral line for many kinds of plasma processing.

According to an aspect of the invention, the object of the present invention described above is realized by providing a discharge plasma processing device comprising a vacuum chamber with an evacuation system for processing an object with plasma, a magnetic field generation system for generating a magnetic neutral line in the vacuum chamber, and an electric field generation system for applying an electric field along the magnetic neutral line formed in the vacuum chamber in order to produce plasma by discharge along the magnetic neutral line.

For simplicity, a circular configuration is assumed for the following presentation first, since any shape of the closed loop is topologically the same as a circle and the circular configuration has being cited actually for many kinds of plasma processing.

Regarding the formation of a circular magnetic neutral line, the magnetic field generation system preferably may comprise at least two electromagnetic coils of a ring conductor, which are used for the magnetic field generation and are located coaxially but separated keeping a distance. When electric currents flow in steady state in the both coils respectively, a circular magnetic neutral line is formed coaxially with the coils as the result of circularly connected zero magnetic field points. In the case that equal current runs in a same sense in the both coils of a same size, the circular magnetic neutral line appears in the midplane between the two coils, with a smaller radius than that of the coils. When the two coil current values running in the same sense are different from each other, the axial position of the circular magnetic neutral line approaches to the lower current coil, apart from the higher current coil. Even in the case that the current in one coil is in the reversed sense of that in the other coil, the circular magnetic neutral line may appear axially close to the coil of the lower current, apart from the high current coil. Accordingly, the axial position of the circular magnetic neutral line may be regulated by controlling the excitation currents which are fed to the respective magnetic field generation coils.

Regarding the plasma production along the formed circular magnetic neutral line, the electric field generation system preferably may comprise a coil for radio frequency alternating electric field induction with a rf electric power application system, and a rf induction coil may be wound close to but outside to the circular magnetic neutral line. The electric field generating system may alternatively be a single turn coil made of a metal strip or a strip-shaped netting metal wires, having a width large enough to accommodate any axial displacement of the circular magnetic neutral line so as to keep efficient input of electric power for the plasma production in the circular magnetic neutral line.

To make controllable the diameter of the ring plasma produced in the circular neutral magnetic line formed in the midplane between the two coils of a same size in which a same current flows respectively, the third coil of the same size as the first two coils may be preferably disposed coaxially in the midplane. When the current of the third coil flows in steady state in the sense opposite of that of the first two coils, the circular magnetic neutral line splits on the same plane into two concentric circles, inner circle and outer one. The diameter of the inner circle is smaller than that before splitting. As far as plasma is produced in the inner neutral magnetic circle, the diameter of the plasma ring can be controlled by changing the third coil current running in the sense opposite of that of the first two coils.

Then, three circular ring shaped objects exist concentrically in the same midplane: the ring plasma produced in the circular magnetic neutral line innermost, the rf electric field induction coil in the middle, and the third coil for controlling the radius of the circular magnetic neutral line outermost. So that it is necessary to keep effective induction or rf electric field in the circular magnetic neutral line against mutual interference between the currents in both coils due to the geometric adjacency.

To avoid this defect, the difference of current flowing form between steady current of body flow and rf alternating current of surface flow may be preferably applied. A coil having a double layer core structure on the cross-sectional view may be used for that purpose providing a thin electrical insulation zone between the two layers in which the steady current flows inside while the rf alternating current outside.

According to another aspect of the invention, there is provided a discharge plasma processing device for processing an object with plasma, which comprises a vacuum chamber, a hollow cylindrical permanent magnet of thick wall having its N- and S- poles at the both ends respectively, an electromagnetric coil for steady current disposed coaxially and movable along the axis within the hollow cylindrical permanent magnet and a rf current coil to apply an electric field along a circular magnetic neutral line to be formed by the superposition of magnetic field of the hollow cylindrical permanent magnet and that of the steady current coil whose sense is reverse to that of the hollow permanent magnet.

By controlling the current of the steady coil and its axial position, the radius of the circular magnetic neutral line and its axial position can be regulated as programmed.

According to a further aspect of the invention, there is provided a discharge plasma processing device for processing an object with plasma, which comprises a vacuum chamber, a magnetic field generation system for forming a straight magnetic neutral line which is made up with zero magnetic field points connected in turn and an electric field generation system for applying a DC or AC electric field between the both ends of the straight magnetic neutral line in order to produce linear plasma there.

With such an arrangement, the magnetic field generation system may comprise either plural sets of linear current bars or plural sets of linearly arranged permanent magnets.

Regarding the formation of a straight magnetic neutral line, the magnetic field generation system preferably may comprise at least two straight conductor bars for the magnetic field generation, which are set in parallel but separated apart from each other keeping a distance. When electric steady currents flow in a same sense in the both bars respectively, the straight magnetic neutral line is formed at a position between the bars in parallel to them. In the case that an equal steady current flows in the same sense in the both bars, the straight magnetic neutral line appears in the middle between the both bars.

To move the straight magnetic neutral line located at the middle to the direction vertical to the plane determined with the two parallel bars, the third bar of steady current located in parallel to the straight magnetic neutral line in the plane vertical to the two bars plane of the middle point may be preferably used.

When the steady current of the third bar flows in the sense opposite of that of the first two bars, the straight magnetic neutral line moves away from the orignal position with no steady current of the third bar toward the counter direction, apart from the third bar. Accordingly, the vertical position of the straight magnetic neutral line may be regulated by controlling the excitation currents which are applied to the respective magnetic field generation bars.

A long fine plasma column may be produced by applying a DC or AC electric field between two electrodes set at the both ends of the straight magnetic neutral line. The shape of the two electrodes may be an elongated rectangle or ellipse which is long enough to accommodate any vertical displacement of the straight magnetic neutral line to keep efficient input of electric power for the plasma production in the straight magnetic neutral line.

When the DC current excited in the straight magnetic neutral line formed in the middle between the two bars is higher, the long fine plasma column produced results in the long plasma sheet elongated toward the both steady current bars in the case that the DC current flows in the same sense of that in the two bars, while toward the direction perpendicular to the plane where the both bars are located in the case that the DC current flows in the sense opposite to that of the two bars. This sheet shape of current is caused by the DC current itself flowing in the produced plasma. The width of the sheet elongated depends on the ratio of the DC current to that in the two bars. Such a sheet plasma may be also applicable to many of plasma processing like as, coating, sputtering and ashing.

The idea on the use of plasma produced in a closed or opened magnetic neutral line is available not only in the case of circle and straight line but also any other arbitrary shape of any size at a variable distance from the object to be processed. Ellipse, rectangle and S-figure snaked line are also applicable. As an example, a rectangular magnetic neutral loop may be applied for sputtering process with Indium Tin Oxide ITO cathode target of rectangler shape.

In principle, the plasma produced by discharge along a magnetic neutral line is well thermalized and feeds electric power so quickly, because any charged particle accelerated by electric field collides each other so often through its interaction with steeply changing magnetic field in the vicinity of the neutral points of zero magnetic field where any adiabatic condition on particle motion can not be held, in contrary with usual case that suprathermal particles grow by electric field without magnetic field or with parallel magnetic field. Accordingly, such thermalization characteristics of the plasma located in the magnetic neutral line are apt to result in an effective transmission of the electric power applied.

Plasma produced in such a magnetic neutral line diffuses beyond the magnetic field freely but partially prohibited by the magnet field concerning to higher temperature electrons. Electron-neutral collision and ion-neutral collision are dominant in the diffusion.

However, plasmas are being successively generated in the magnetic neutral line as far as electric field is being applied there. The electric power transfer efficiency to plasmas is so high due to the characteristics of quick and well thermalization mechanism as described above.

According to the aimed processing like as cleaning, coating, etching, supttering and plasma CVD, many kinds of processing scheme can be considered by using the plasma produced in the magnetic neutral line.

DETAILED DESCRIPTION OF THE PREFERRED EMBODIMENTS

Now, the present invention will be described by way of example with reference to the accompanying drawings that illustrate preferred embodiments of the invention.

Figure 1:
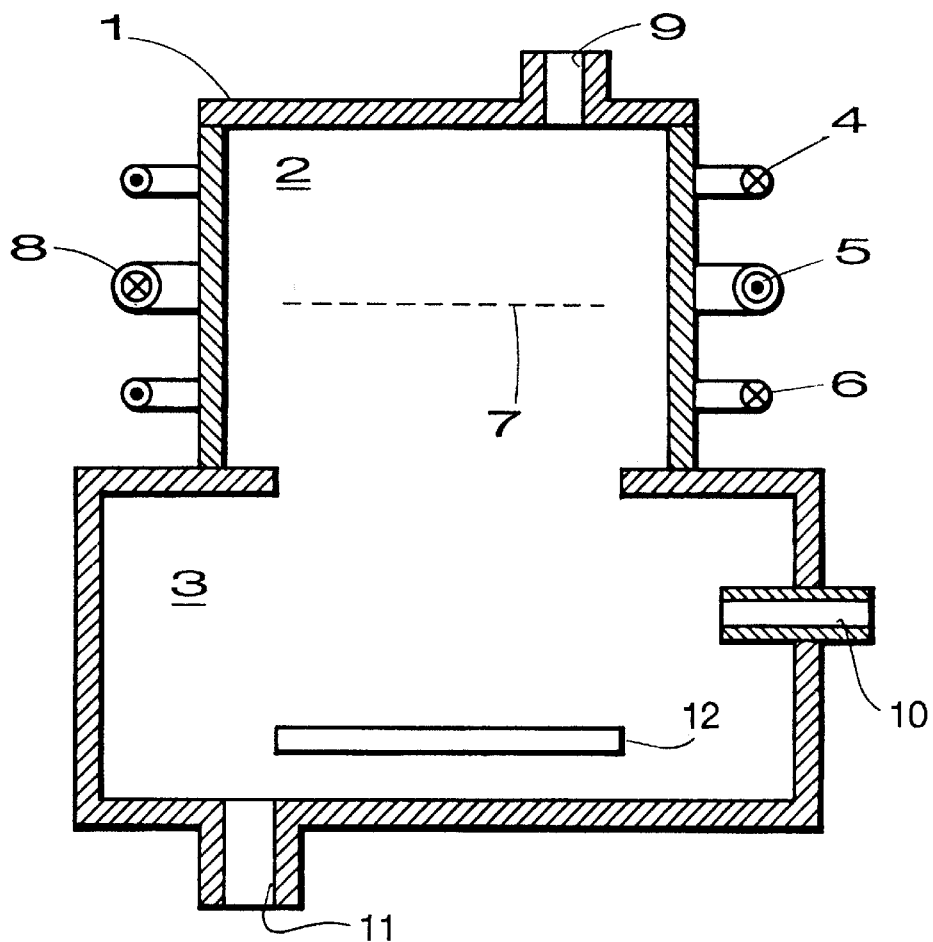
FIG. 1 is a schematic sectional view of a preferred embodiment of the circular magnetic neutral line discharge plasma processing device according to the invention.
Figure 2:
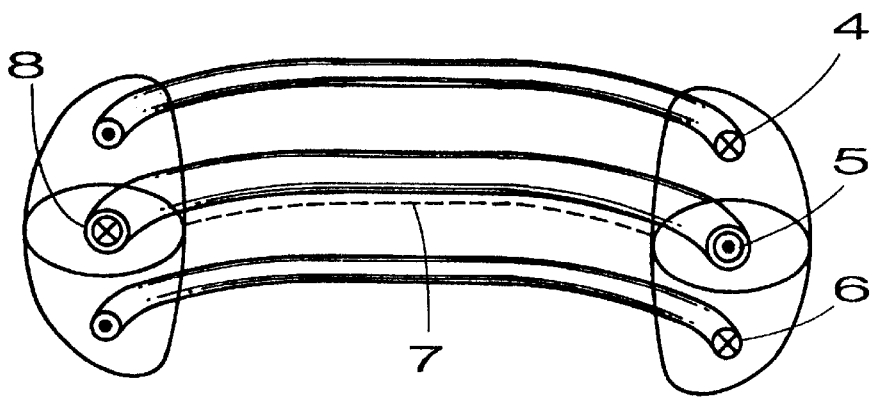
FIG. 2 is a schematic illustration showing how the magnetic field line of force is formed in the embodiment of FIG. 1.
Figure 3:
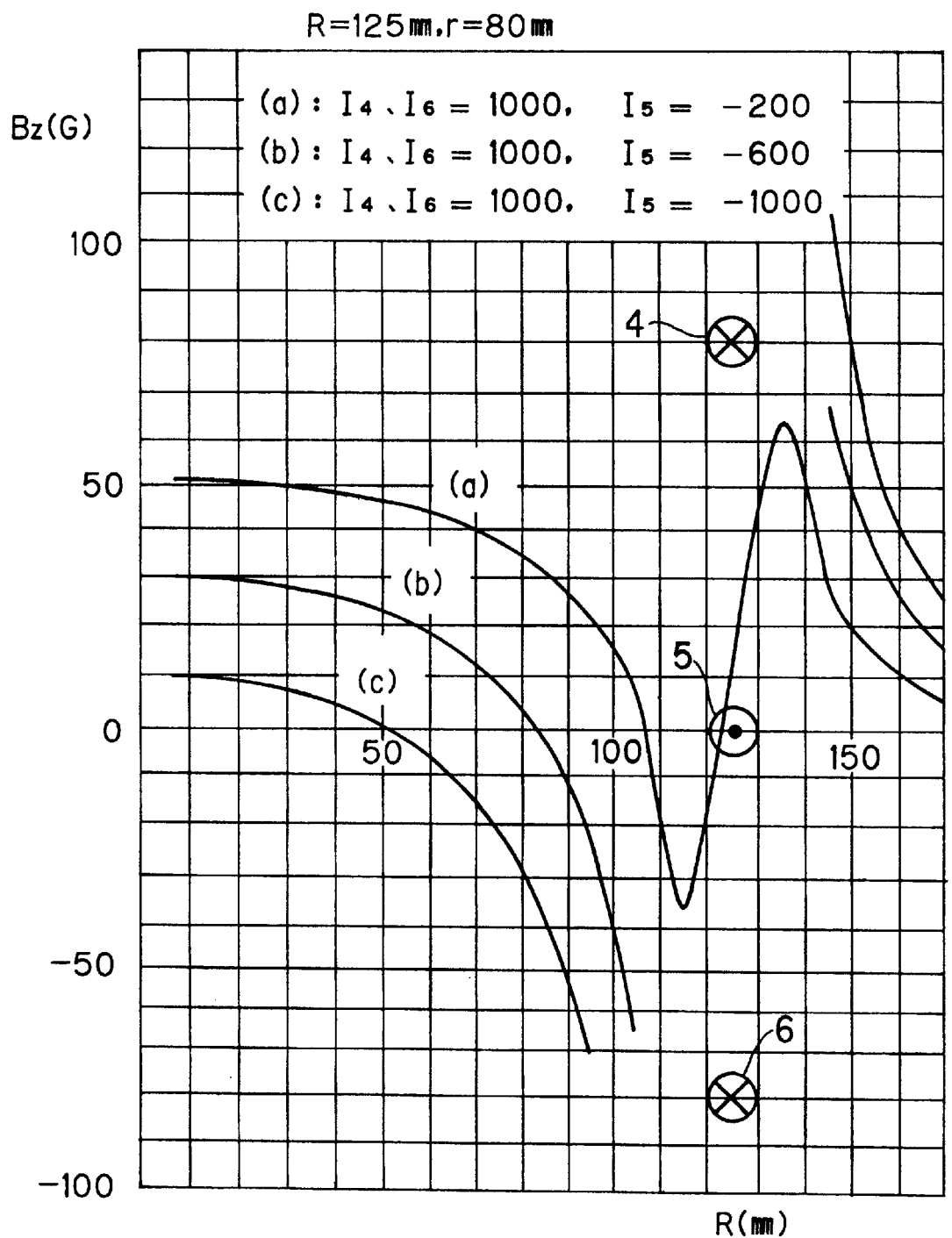
FIG. 3 is a graph showing the displacement of the zero magnetic field points depending on the reverse current in the meddle coil, while keeping a steady current in the other two coils.
Figure 4:
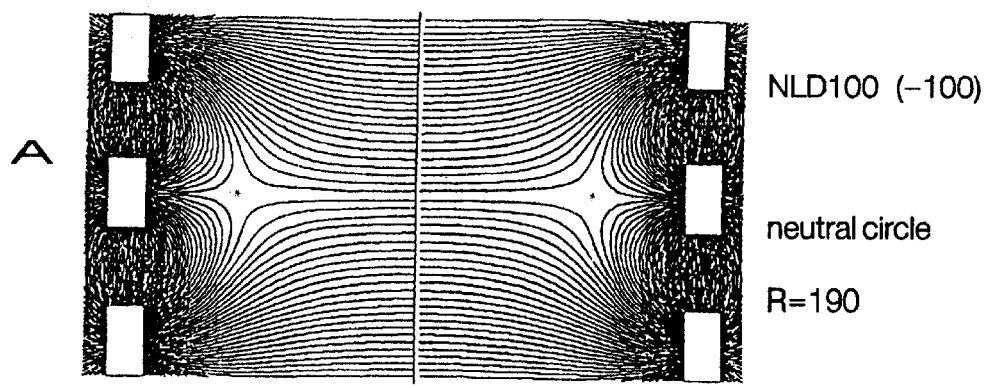
FIG. 4 is graphs of computer-simulated equipotential line of magnetic field showing how the position of the zero magnetic field points is changed as a function of the change in the middle coil current.
Figure 4:
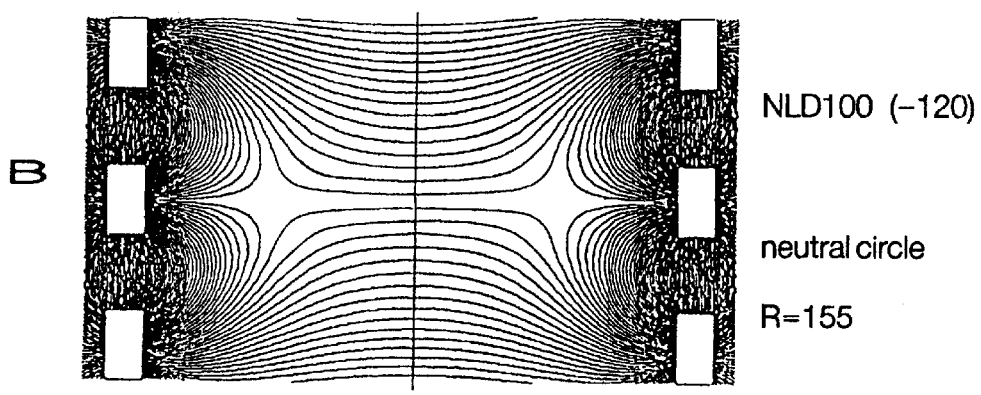
Figure 4:
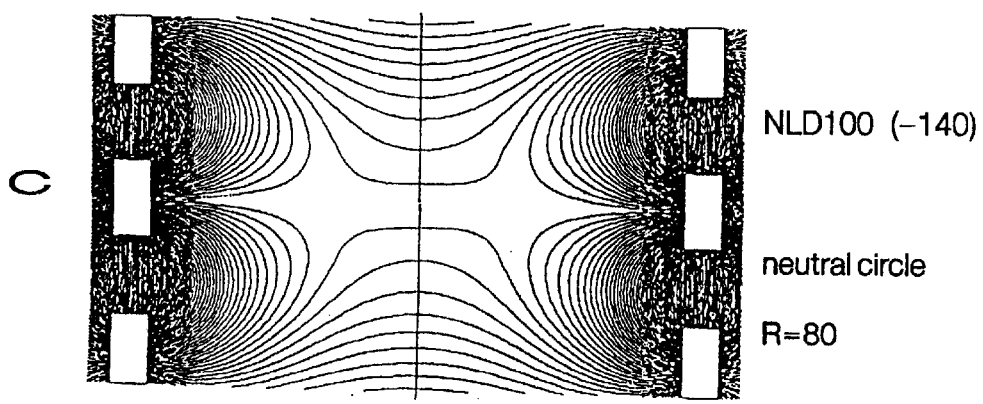

FIG. 1 shows a first preferred embodiment of the invention comprising a cylindrical vacuum chamber 1 in which a space 2 is designed for plasma production and which also includes a substrate processing space 3. A total of three electromagnetic coils 4, 5 and 6 are arranged coaxially with an equal axial distance as magnetic field generation means outside of the cylindrical vacuum chamber wall of an. insulator material, of which the upper and lower coils 4 and 6 are subjected to respective steady currents $I_4$ and $I_6$ running in a same sense, whereas an steady current $I_5$ is applied to the intermediary coil 5 in the sense opposite to that of the currents $I_4$ and $I_6$ With this arrangement, a circular magnetic neutral line 7 is formed as the line made up with zero magnetic field points connected continuously shown by a broken line in FIG. 2. The size and the position of the circular magnetic neutral line 7 may be arbitrarily and specifically defined by appropriately selecting the ratio of the currents $I_4$ and $I_6$ to the current $I_5$. For instance, if $I_4 > I_6$ the level of the magnetic neutral line moves axially downward to the coil 6, whereas it rises toward the coil 4 if $I_4 < I_6$. On the other hand, as the current $I_5$ increases, the diameter of the magnetic neutral line reduces, and at the same time the gradient of the magnetic field around the zero magnetic field points decereases as typically shown in FIG. 3. FIG. 4 is a diagram showing equipotential lines of magnetic field obtained by a computer simulation, in which A, B and C illustrate how the position of the zero magnetic field points changes when the excitation currents for the respective electromagnet coils change.

A high frequency coil 8 for generating an electric field is arranged as the outer layer of a double layer core structure coil with the intermediary electromagnetic coil 5 inside with a thin electrical insulation zone between them. A high frequency induction electric field (e.g. with a frequency of 13.56 Hz) is applied through the high frequency coil 8 along the circular magnetic neutral line 7.

As the high frequency current runs along the surface of outer layer of the coil due to skin effect, while the steady current for the intermediary coil runs as a body current, any mutual interaction between both circuits may be avoided. So that both currents, the rf current and the steady current can be independently controlled. A gas inlet port 9 is arranged at the top of the space for plasma production through which gas is introduced into the vacuum chamber to make plasma. Appropriate preliminary heating and ignition means (not shown) may be additionally provided if necessary, to facilitate electric discharge to take place there. According to certain related empirical observations, such an electric discharge can be triggered with ease by using ultraviolet rays.

In the substrate processing place 3, there is provided a gas inlet port 10 and an exhaust port 11 at the bottom, which are connected respectively to a gas supply source and an exhaust pump. Reference numeral 12 denotes a substrate to be processed.

When the device having a configuration as illustrated in FIG. 1 is operated, a ring plasma is generated in the circular magnetic neutral line 7 by the high frequency current excited in the coil 8. The generated plasma expends freely in space and is used for processing the substrate 12. Note that plasma is constantly generated by the high frequency induction field and comes out as if over-flowing from the inside of the circular magnetic neutral line. Also note that the distance from the substrate 12 and the diameter of the circular magnetic neutral line 7 can be regulated even during the processing period by controlling the current $I_4$ and $I_6$ respectively as well as the current 15.

Figure 5:
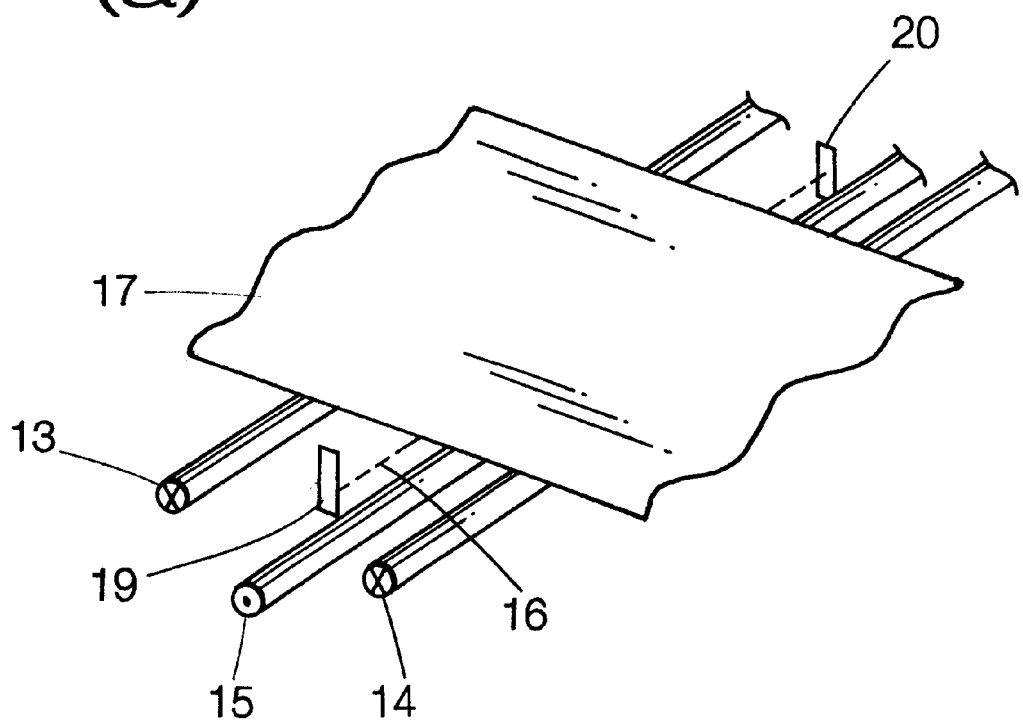
FIG. 5 is a schematic perspective view of another preferred embodiment of the invention as a straight magnetic neutral line discharge plasma processing device.
Figure 5:
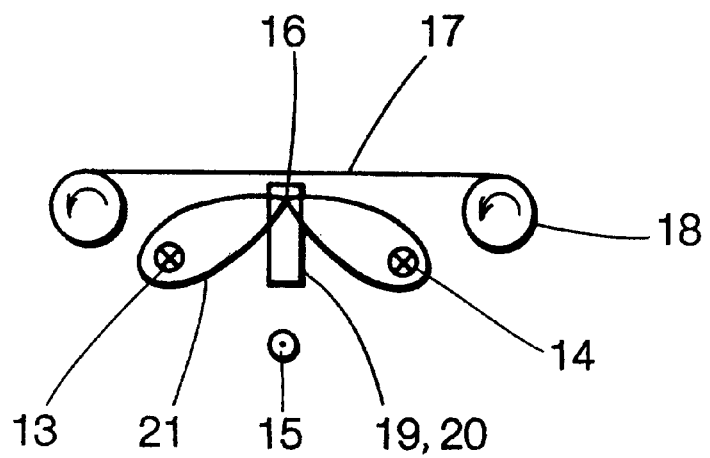

FIG. 5 shows another embodiment of the invention, which is a surface cleaning apparatus having two steady current bars 13 and 14 and a third control current bar 15, in which plasma is produced in a straight magnetic neutral line 16 for cleaning the surface of a belt-shaped object 17 pulling out of a roll 18. The equal steady current is running in the two bars 13 and 14 arranged horizontally to form the straight magnetic neutral line in the middle position and the current in the third bar 15 located beneath the straight magnetic neutral line acts for controlling the vertical position of the straight magnetic neutral line, along which AC or DC electric field is applied between two electrodes 19 and 20 set respectively at the both ends of the straight magnetic neutral line in order to produce well-thermarized plasma there. Generated fine plasma column expends easier upward direction in which direction no current carrying bar exists and serves to clean up the under surface of the object or sheet 17 puling out of the roll 18. Reference numeral 21 denotes the magnetic line of force crossing through the zero magnetic field point.

Figure 6:
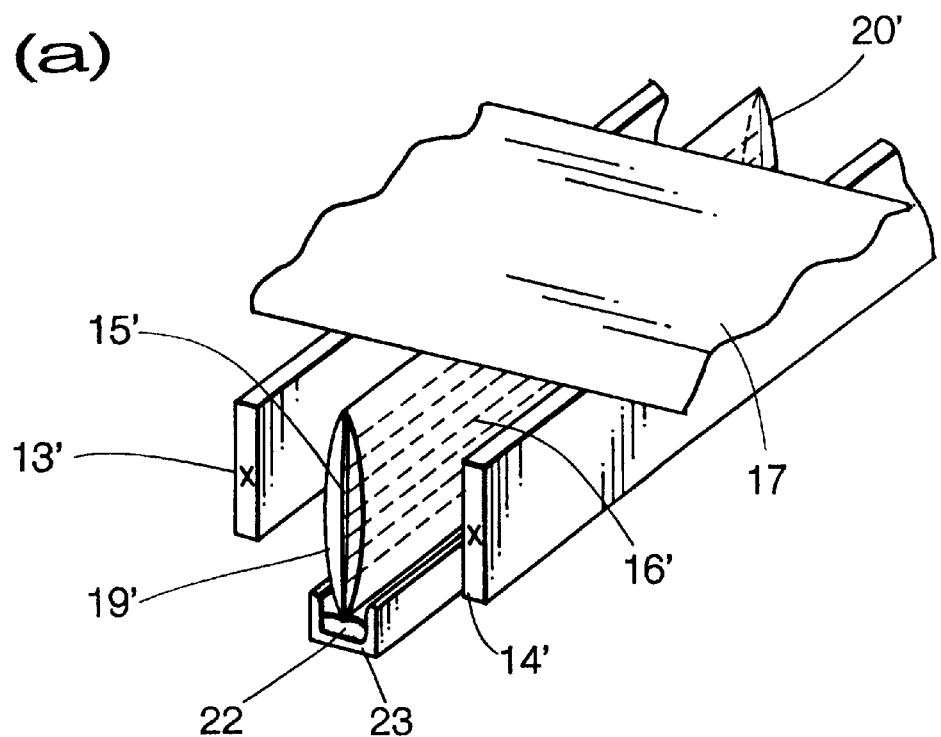
FIG. 6 is a schematic perspective view showing a case that the shape of plasma produced in the straight magnetic neutral line is a sheet owing to a higher direct current flowing in the sheet itself as a further preferred embodiment of the invention.
Figure 6:
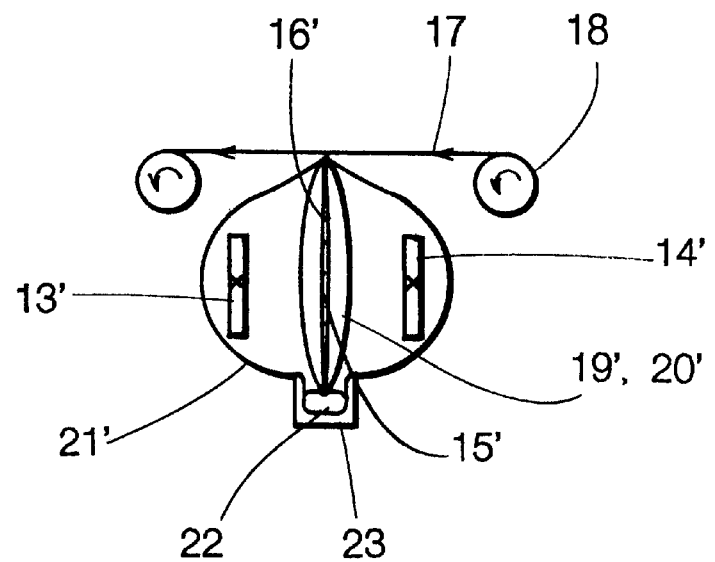

FIG. 6 shows a special embodiment of an extention of the invention illustrated in FIG. 5. In the illustrated device a pair of steady current bar 13' and 14' each having more elongated cross-section are arranged, and in this case a sheet plasma 15' is easily generated. When the DC current flowing in the plasma produced along the straight magnetic neutral line become higher, the plasma no longer keeps the shape of fine column and changes to a sheet shape as well as the straight magnetic neutral line is deformed to a magnetic neutral sheet structure. In FIG. 6, an apparatus for surface improvement of a strip-shaped object with the sheet plasma is shown as the extend embodiment illustrated in FIG. 5. As the sense of DC plasma current in the straight magnetic neutral line is opposite to the other those of two bars 13' and 14', the developed magnetic neutral sheet 16' widens with plasma to the vertical direction. The lower edge of the sheet plasma 15' touches a metal 22 casted in a slender pot 23 and vaporize it, while the upper edge of the sheet plasma may give an effect for improvement on the surface character of a strip-shaped object 17 from a roll 18. References numeral 19', 20' and 21' denote the elongated electrodes arranged at the both ends of the magnetic neutral sheet 16' and the magnetic line of force joining to the magnetic neutral sheet respectively.

Figure 7:
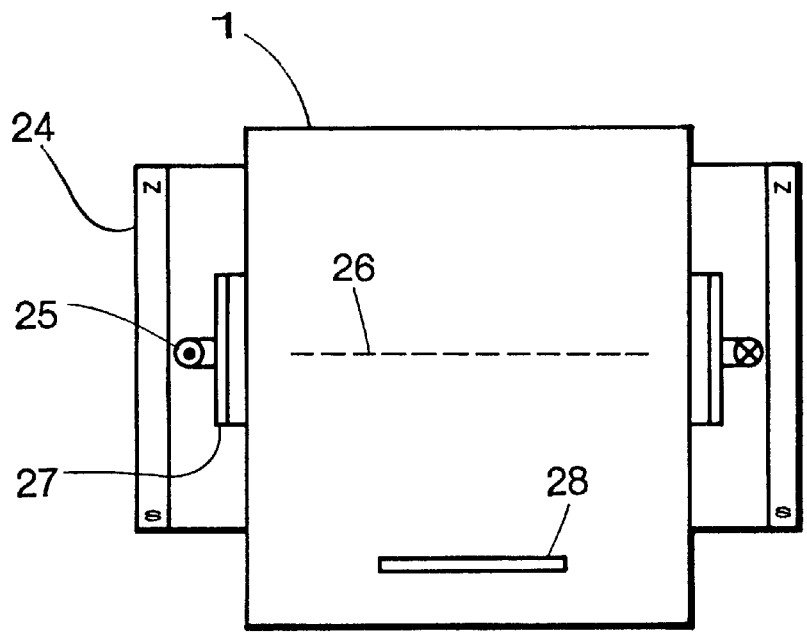
FIG. 7 is a schematic illustration view showing a still another different device obtained also by modifying the embodiment of FIG. 1.

FIG. 7 shows a still another different device obtained by modifying the embodiment of FIG. 1. In this modified embodiment, there are provided a hollow cylindrical permanent magnet 24 of a thick wall confirmation, a electromagnetic coil 25 for steady current disposed coaxially and movable along the axis within the hollow magnet 24 having its N- and S- poles at the both ends respectively and a rf electric field generation coil 27 for induction along a circular magnetic neutral line 26 which is formed by setting the sense of the hollow magnet 24 and that of the steady current coil 25 so that they are counter directed to each other.

The axial position of the circular magnetic neutral line 26 formed inside the vacuum chamber 1 can be arbitrarily and specifically regulated and the diameter of the circular magnetic neutral line also can be arbitrarily and specifically controlled by changing the steady current value, even during the processing. Numeral reference 28 denotes a substrate to be proceed.

Figure 8:
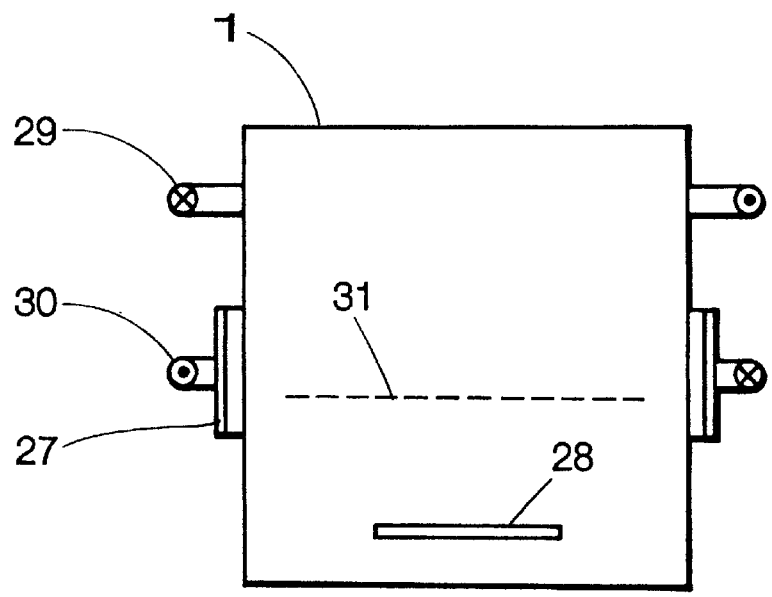
FIG. 8 is a schematic illustration similar to FIG. 7 but showing a still another different device obtained also by modifying the embodiment of FIG. 1.

FIG. 8 is a schematic illustration showing a still different device obtained also by modifying the embodiment of the invention. A circular magnetic neutral line can be formed also in a case that two ring conductor coils 29 and 30 in which equal steady currents are running but each sence is counter direction to each other are arranged coaxially keeping a distance. When the current value of one coil 30 is fairly reduced comparing with that of the another coil 29, the circular magnetic neutral line 31 appears around the reduced current coil 30. Accordingly, the rf induction coil for ring plasma production are settled near the reduced current coil 30 beforehand. In this case, the radius of the circular magnetic neutral line 31 and its distance from the substrate 28 to be processed can be selected not arbitrarily but are defined by the ratio of absolute current values of both coils 29 and 30 at the same time.

Figure 9:
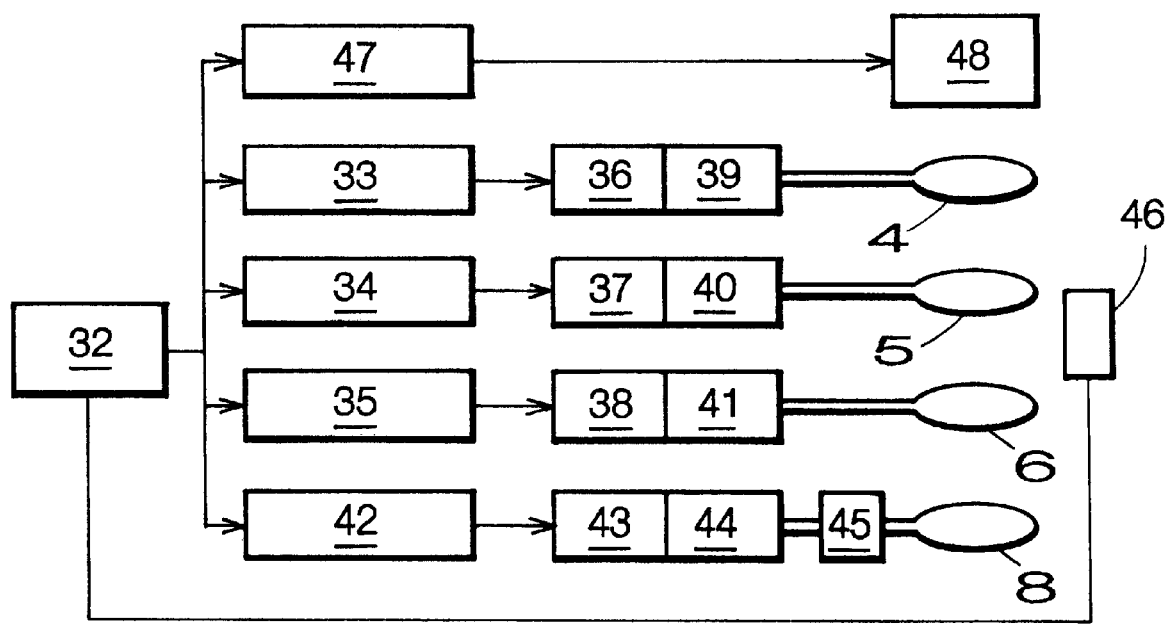
FIG. 9 is a block diagram showing an example of a control system for the device of FIG. 1.

FIG. 9 is a block diagram which explains an example of a control system of several kinds of currents to be fed to the respective coils of the device shown illustrated in FIG. 1. The shown control system includes a control equipment 32 which may be a computer or sequential processor for generating control signals 33, 34 and 35 in accordance with a predetermined programming. Control signals 33, 34 and 35 are used for setting the values and senses of electric current to be fed steadily in the electromagnetic coils 4, 5 and 6, respectively. These control signals are transferred through each interface circuits 36, 37 and 38 to DC suppliers 39, 40 and 41 connected to the coils 4, 5 and 6 respectively, so as to control each current to be fed. In this control system there is also generated an operation signal 42 for controlling the current to be fed to the high frequency coil 8 and its switching on and off. The control signal 42 is transferred through an interface circuit 43 to a high frequency power supplier 44 connected to the high frequency coil 8 via a matching box 45. If necessary, there may be provided a detector 46 for measuring the thickness of a thin film coated on the substrate and a discharge condition like as the density of preionized gas in the vacuum chamber 1. Output signals from the detector 46 is fed to the control equipment 32 for regulating the respective control signals for each supplier. Furthermore, a cathode bias power source 47 is provided for applying a bias voltage (DC or AC) to a cathode 48 for an intended plasma processing.

Figure 10:
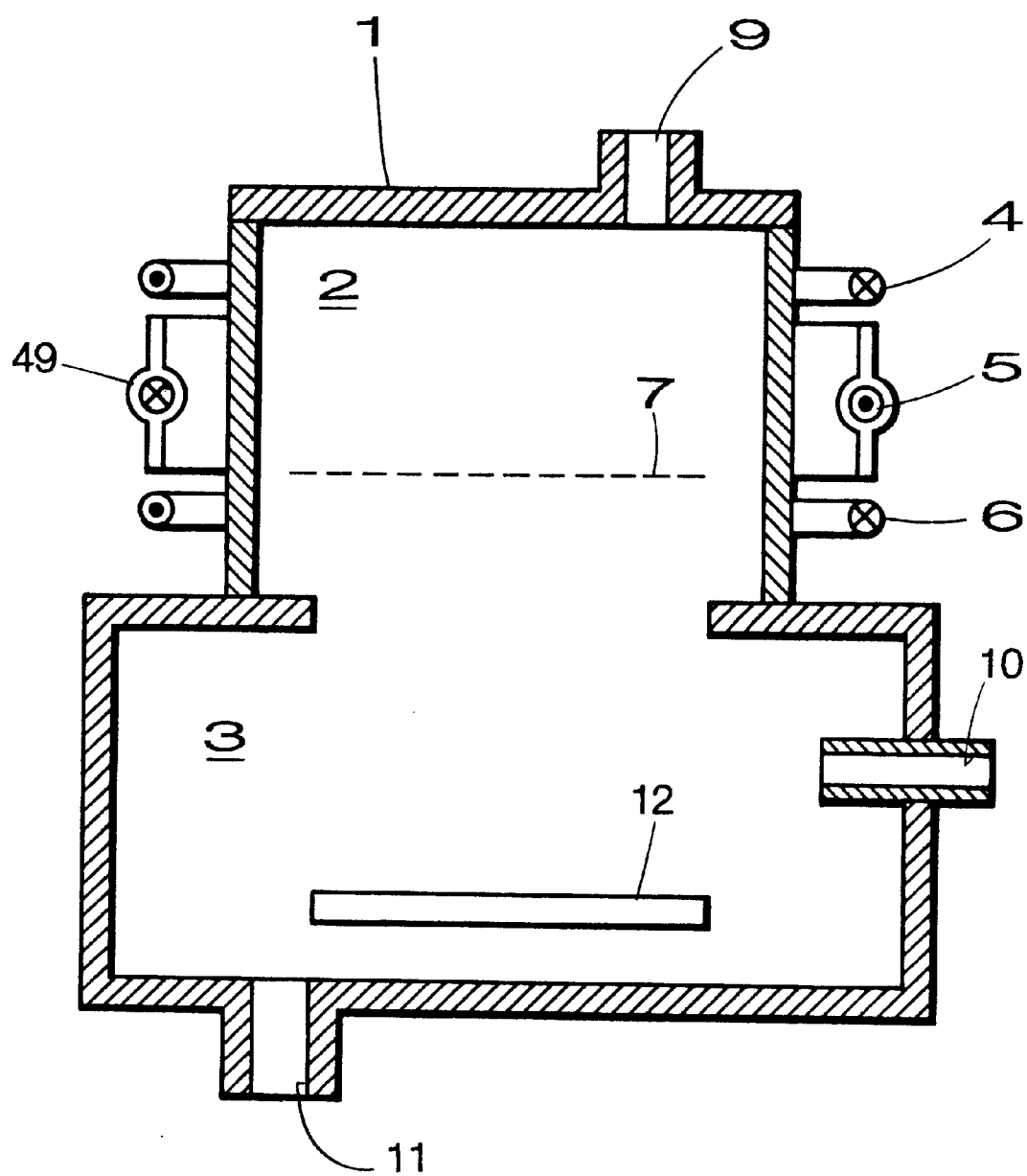
FIG. 10 is a schematic sectional view showing a still another different device obtain also by modifying the embodiment of FIG. 1.

FIG. 10 schematically shows a modification of the device illustrated in FIG. 1 on the invention. Accordingly, every parts in FIG. 10 corresponding to those of the embodiment in FIG. 1 are denoted by the same reference symbols as in FIG. 1. This means that function of each part during the operation using the modified device is completely the same as that explained in FIG. 1, except for the function of a rf coil denoted as 49 comparing with the rf coil refered as 8 in FIG. 1. Only one difference between the two figures is the difference of cross-sectional view of the rf coil wound outside the intermediary coil 5. As will be apparent, the rf coil 49 of FIG. 10 has a belt shape cross-section while the rf coil 8 of FIG. 1 a ring shape. When the belt shape coil has a width large enough to accommodate any axial displacement of the circular magnetic neutral line 7, input of electric power for the plasma production in the circular magnetic neutral line 7 can be kept efficient. The belt shape coil may be a single turn coil of a metal strip or strip-shaped netting metal wires.

Figure 11:
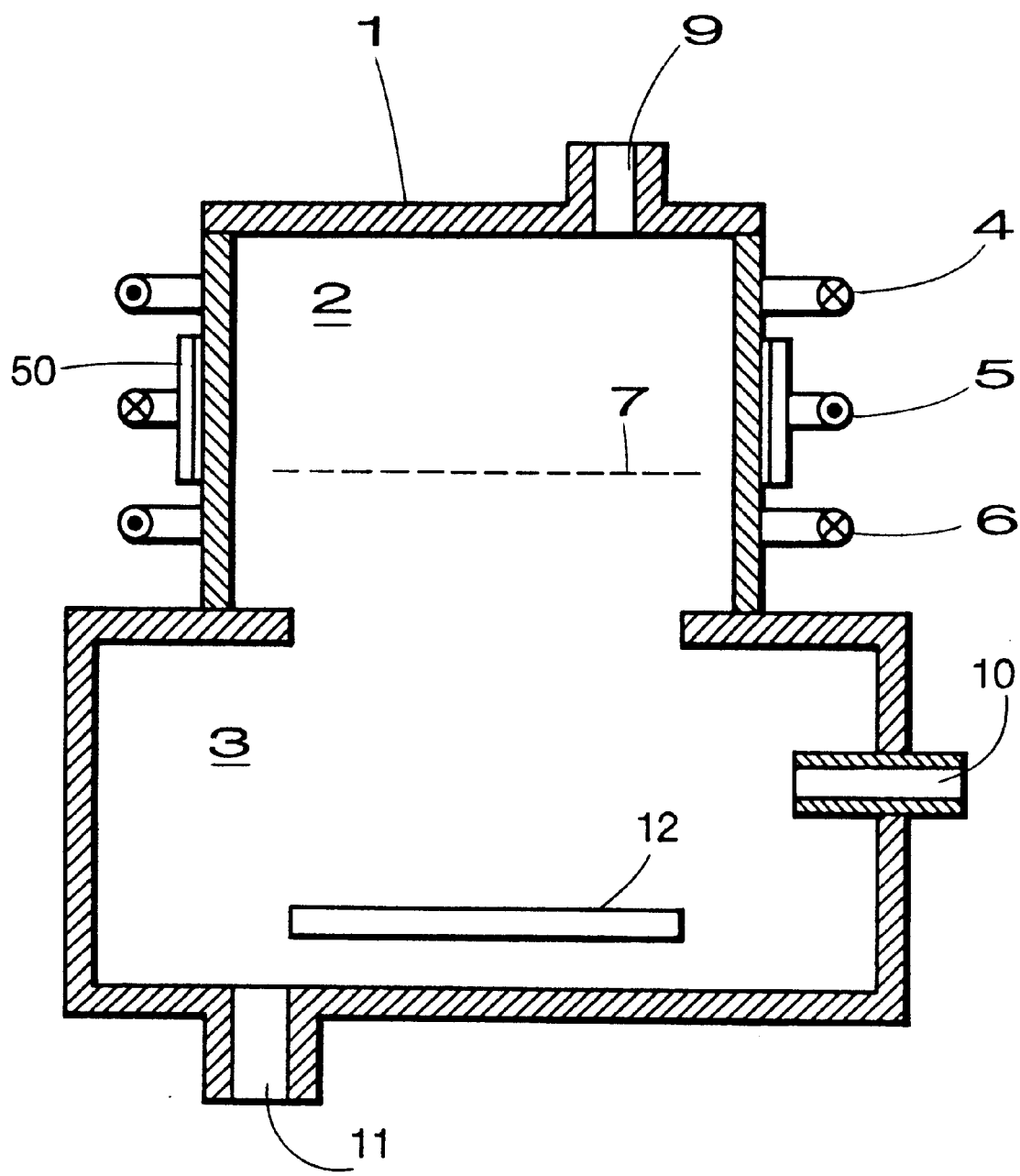
FIG. 11 is a schematic sectional view smillar to FIG. 10 but showing a still different device obtained again by modifying the embodiment of FIG. 1.

FIG. 11 shows a rather fundamental embodiment of the invention. As each part in FIG. 11 denoted as the same reference symbol corresponding to part of the embodiment in FIG. 10 plays the same role as that in FIG. 10, only one difference between the two figures is the difference of cross-section of the rf coil 50 in FIG. 11 and that of the rf coil 49 in FIG. 10.

Both rf coils have a belt-shape cross-section similar together to keep effective power transfer to the plasma. However, the rf coil 49 shown in FIG. 10 has the intermediary coil 5 as the inside structure while the rf coil 50 shown in FIG. 11 is designed separately with the intermediary coil 5. When there is expected no significant mutual interference between the current of the rf coil and that of the intermediary coil, the device shown in FIG. 11 is utilized.

In the invention, a closed or opened magnetic neutral line is not necessarily limited to circle and straight one, but any other arbitrary shape of any size of a magnetic neutral line can be realized at a variable distance from the object to be processed.

Figure 12:
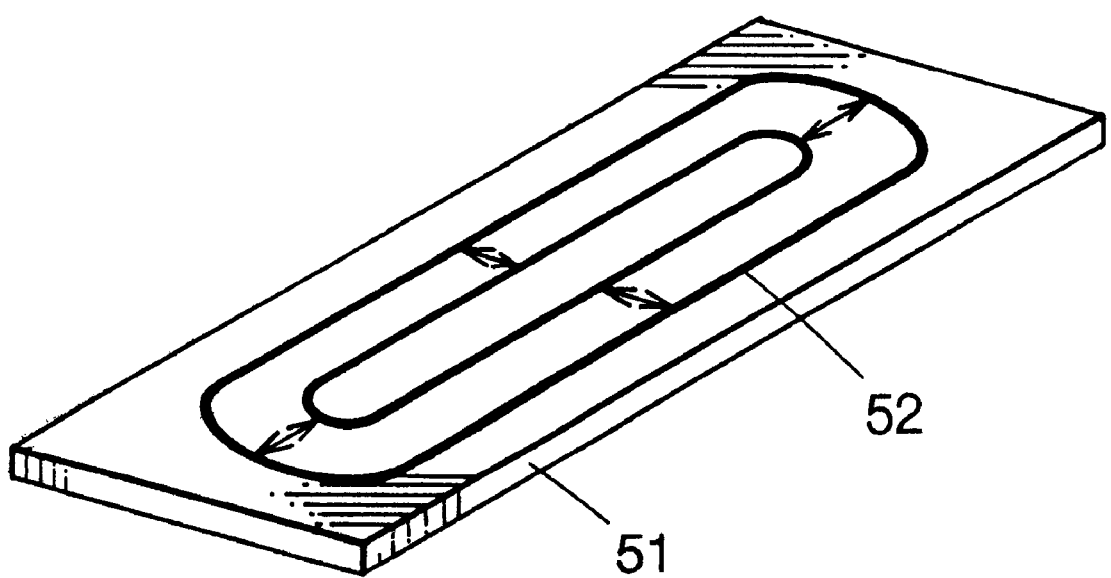
FIG. 12 is a schematic perspective view of a rectanglar type supttering cathode to which the present invention can be applied, showing a possible displacement of the discharge of the cathode.

FIG. 12 shows such an exemplary embodiment to be realized according to the invention. It is a shematic perspective view of a rectangular type cathode 51 for a sputtering device to which the present invention is applied. As three steady current coils assorted in three layers are arranged along the four sides of the rectangular cathode 51 to form a race-track shaped magnetic neutral line 52, a race-track plasma is produced by induction of rf electric field in the magnetic neutral line with a rf coil wound around the four sides. By controlling the steady current in the intermediary coil, the size of the race track plasma can be variable owing to the change of the magnetic neutral line as shown with arrows in FIG. 12.

While three electromagnetic coils are used in most of the above described embodiments, a pair of coils are sufficient in principle to make a circular magnetic neutral line as in the case of the embodiment of FIG. 8. However, if plasma is hoped to be produced in the form of layered discs, plural circular magnetic neutral lines arranged vertically may be utilized by providing three or more electromagnetic coils to generate such plasmas. Additionally, while a high frequency coil is designed as the outer layer zone of a double layer core structure coil with an intermediary coil inside in most of the above described embodiments, it may be replaced by a plural coils in which one coil act as the rf coil and the other as the intermediary coil as shown in FIG. 11.

All or some of the electromagnetic coils in the above described embodiments may be replaced by permanent magnets to generate the circular magnetic neutral line.

While two or three linear current bars are used for magnetic field generation in each of the embodiments of FIG. 5 and 6, they may be replaced by plural sets of permanent magnets separated in a number of lineally arranged groups. The dimensions and arrangement as well as the number of the linear current bars may be appropriately selected depending on the practical application of the device.

While the coils for magnetic field generation and the rf coil for electric field induction are arranged outside the vacuum chamber in any of the above described embodiments, they may alternatively be arranged inside the vacuum chamber in order to eliminate any crossing the magnetic lines of force through the chamber wall made of an insulator material.

In any of the above described embodiments, the coils or current bars may be coated on the surface with an insulation material relatively free from outgassing. This is particularly important to avoid unnecessary discharge between the plasma produced in the magnetic neutral line and the coils or current bars settled inside the vacuum chamber.

As described above in detail, since a discharge plasma processing device according to the invention comprises a magnetic field generation system to actualize a magnetic neutral line and an electric field generation system to apply an electric field along the magnetic neutral line created in a vacuum chamber so as to produce a discharge plasma in the magnetic neutral line, the magnetic neutral line can be arbitrarily modified in terms of its location relative to the object to be processed and/or its size simply by regulating the excitation currents in the respective electromagnetic coils. This means that any type of plasma processing can be programmed by changing the position and the size of plasma produced in the magnetic neutral line even during the process operation.

Additionally, the plasma produced by discharge along a magnetic neutral line is so quickly thermalized that the plasma feeds electric power effectively, because any charged particles accelerated by electric filed applied collides each other so often through its interaction with steeply changing magnetic field in the vicinity of the neutral points of zero magnetic field where any adiabatic condition on charged particle motion can not be held. Such a thermalization characterstics of the plasma located in the magnetic neutral line tends to make the electric power transmission to the plasma so effective.

Finally, a plasma produced in a magnetic neutral line is so available as shown in any of the above described embodiments that a discharge plasma processing device according to the invention is insisted as a most useful device for many kinds of plasma processing. Because a discharge plasma processing device to be realized by the invention has a simple cofiguration and is able to regulate not only plasma parameters but also the size of plasma and its distance relative to the object by controlling power input to the plasma and the steady currents in the respective coils bars with a computer for the operation. Consequently, any kinds of plasma processing may be easily realized as programmed, for instance, extremely in uniform on the surface of the object.

What is claimed is:

1. A discharge plasma processing device including a vacuum chamber for processing an object with plasma, said device further comprising, within the vacuum chambers, a magnetic field generating means for forming a magnetic neutral line of zero magnetic field points connected continuously in the vacuum chambers and an electric field generating means for applying an electric field along the magnetic neutral line formed in the vacuum chamber in order to produce a discharge plasma along the magnetic neutral line.

2. A discharge plasma processing device according to claim 1, wherein said magnetic field generating means comprises electromagnetic coils coated with an insulation material.

3. A discharge plasma processing device according to claim 1, wherein said magnetic field generating means comprises at least one pair of magnetic field generating circular coils of the same size arranged coaxially in spaced relation so as to form at least one circular magnetic neutral line between any neighboring coils by steady currents applied thereto in the same sense.

4. A discharge plasma processing device according to claim 3, wherein said magnetic neutral line is regulated its axial position relative to said magnetic field generating coils by controlling the excitation current applied to each of said magnetic field generating coils.

5. A discharge plasma processing device according to claim 1, wherein said magnetic field generating means comprises a pair of coaxially arranged circular coils, of the same size and spaced apart from one another, having electric currents running through respective coils of different values in a sense opposite to each other so that a circular magnetic field line is formed near the coil of lower current by controlling the ratio of said electric currents.

6. A discharge plasma processing device according to claim 1, wherein said magnetic field generating means comprises three magnetic field generating circular coils, of the same size and arranged coaxially with an equal distance between neighboring coils, in which electric currents flow in a sense opposite to that in a neighboring coil, and the diameter of the circular magnetic neutral line formed around an intermediary coil level and the magnetic field gradient at zero magnetic field points are controlled by changing the ratio of current of the intermediary coil while keeping currents of the remaining two coils at an equal value.

7. A discharge plasma processing device according to claim 1, wherein said magnetic field generating means comprises a hollow cylindrical permanent magnet having a thick wall and having N- and S- poles at each end thereof and a steady current electromagnetic coil disposed coaxially and movably along the axis within the hollow cylindrical permanent magnet for forming a circular magnetic neutral line, and said circular magnetic neutral line being defined in axial and radial terms by modifying the axial position of the steady current coil and the value of the steady current itself.

8. A discharge plasma processing device according to claim 1, wherein said electric field generating means comprises a high frequency alternating field coil located close to the circular magnetic neutral line in combination with a magnetic field generating coil disposed near the circular magnetic neutral line.

9. A discharge plasma processing device according to claim 8, wherein said electric field generating means comprises a high frequency alternating field coil made of a metal strip or stripshaped netting metal wires having a width large enough to accommodate axial displacement of the circular magnetic neutral line.

10. A discharge plasma processing device according to claim 9, wherein said electric field generating means comprises a high frequency alternating field coil of a strip shape with a certain thickness, at least one of said magnetic field generation coils being buried within said high frequency coil in an electrically insulated relation thereto.

11. A discharge plasma processing device according to claim 1, wherein said magnetic field generating means comprises three circular electromagnetic coils of the same size and arranged coaxially with an equal distance between neighboring coils, said coils including an intermediary electro-magnetic coil forming an inner core of a double layer core structure coil, an outer layer of said double layer core structure serving as a rf current coil of said electric field generating means to induce a high frequency electric field along the circular magnetic neutral line, and a thin electrical insulation zone being provided between the inner core and the outer layer.

12. A discharge plasma processing device according to claim 1, wherein said magnetic field generating means and electric field generation means have a form identical with that of the object to be processed so that the discharge plasma is produced along a closed magnetic neutral line having the same shape as that of the object to be processed.

13. A discharge plasma processing device including a vacuum chamber for processing an object with plasma, said device comprising, within the vacuum chamber, a magnetic field generating means for forming a straight magnetic neutral line of zero magnetic field points connected in sequence in the vacuum chamber, first and second electrodes respectively disposed at opposite ends of said straight magnetic neutral line, and an electric field generating means for applying a direct or an alternating electric field along the straight magnetic line between said first and second electrodes in order to produce a linear plasma source.

14. A discharge plasma processing device according to claim 13, wherein said magnetic field generating means comprises a plurality linear current bars located separately in a plurality of linearly arranged groups.

15. A discharge plasma processing device according to claim 14, wherein each of said linear current bars is coated with an insulation material.

16. A discharge plasma processing device according to claim 13, wherein said magnetic field generating means comprises a plurality of permanent magnets located separately in a number of linearly arranged groups.

* * * * *